(12) United States Patent
Evans et al.

(10) Patent No.: US 11,554,445 B2
(45) Date of Patent: *Jan. 17, 2023

(54) METHODS FOR CONTROLLING ETCH DEPTH BY LOCALIZED HEATING

(71) Applicant: Applied Materials, Inc., Santa Clara, CA (US)

(72) Inventors: Morgan Evans, Manchester, MA (US); Joseph C. Olson, Beverly, MA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 525 days.

This patent is subject to a terminal disclaimer.

(21) Appl. No.: 16/694,580

(22) Filed: Nov. 25, 2019

(65) Prior Publication Data
US 2020/0189036 A1   Jun. 18, 2020

Related U.S. Application Data

(60) Provisional application No. 62/780,802, filed on Dec. 17, 2018.

(51) Int. Cl.
*B23K 26/34* (2014.01)
*C04B 41/00* (2006.01)
(Continued)

(52) U.S. Cl.
CPC ............ *B23K 26/34* (2013.01); *B23K 26/364* (2015.10); *C04B 41/0036* (2013.01);
(Continued)

(58) Field of Classification Search
CPC ...... G02B 5/1857; G02B 5/1819; G02B 6/34; B23K 26/364; C04B 41/0036
See application file for complete search history.

(56) References Cited

U.S. PATENT DOCUMENTS

| 7,643,709 B2* | 1/2010 | Van Laere | G02B 6/124 |
| | | | 385/129 |
| 9,287,148 B1* | 3/2016 | Evans | H01J 37/3171 |

(Continued)

FOREIGN PATENT DOCUMENTS

| CN | 108873350 A | 11/2018 |
| EP | 3717967 A1 | 10/2020 |

(Continued)

OTHER PUBLICATIONS

Taiwan Office Action issued to Application No. 110128042 dated Mar. 9, 2022.

(Continued)

*Primary Examiner* — Michael P Wieczorek
(74) *Attorney, Agent, or Firm* — Patterson & Sheridan, LLP

(57) ABSTRACT

Embodiments of the present disclosure relate to methods for controlling etch depth by providing localized heating across a substrate. The method for controlling temperatures across the substrate can include individually controlling a plurality of heating pixels disposed in a dielectric body of a substrate support assembly. The plurality of heating pixels provide temperature distributions on a first surface of the substrate disposed on a support surface of the dielectric body. The temperature distributions correspond to a plurality of portions of at least one grating on a second surface of the substrate to be exposed to an ion beam. Additionally, the temperatures can be controlled by individually controlling light emitting diodes (LEDs) of LED arrays. The substrate is exposed to the ion beam to form a plurality of fins on the at least one grating. The at least one grating has a distribution of depths corresponding to the temperature distributions.

14 Claims, 5 Drawing Sheets

(51) Int. Cl.
*G02B 5/18* (2006.01)
*G03F 7/00* (2006.01)
*B23K 26/364* (2014.01)
*G02B 6/34* (2006.01)
*F21V 8/00* (2006.01)
*G06F 3/01* (2006.01)

(52) U.S. Cl.
CPC ......... *G02B 5/1819* (2013.01); *G02B 5/1857* (2013.01); *G02B 6/34* (2013.01); *G03F 7/0005* (2013.01); *G02B 6/0016* (2013.01); *G02B 6/0065* (2013.01); *G06F 3/011* (2013.01)

(56) References Cited

U.S. PATENT DOCUMENTS

| | | | |
|---|---|---|---|
| 11,247,298 B2* | 2/2022 | Evans | G03F 7/0005 |
| 2007/0263973 A1 | 11/2007 | Van Laere et al. | |
| 2010/0323532 A1 | 12/2010 | Carey et al. | |
| 2014/0073145 A1 | 3/2014 | Moffatt et al. | |
| 2016/0035539 A1* | 2/2016 | Sainiemi | H01J 37/3053 |
| | | | 204/298.36 |
| 2017/0003504 A1 | 1/2017 | Vallius et al. | |
| 2018/0052501 A1 | 2/2018 | Jones, Jr. et al. | |
| 2018/0059297 A1 | 3/2018 | Peroz et al. | |
| 2018/0095201 A1 | 4/2018 | Meili et al. | |
| 2018/0233367 A1 | 8/2018 | Farley et al. | |
| 2019/0212480 A1 | 7/2019 | Evans et al. | |
| 2019/0258008 A1 | 8/2019 | Hautala et al. | |

FOREIGN PATENT DOCUMENTS

| | | |
|---|---|---|
| EP | 3931609 A1 | 1/2022 |
| JP | H0653600 A | 2/1994 |
| JP | H06201909 A | 7/1994 |
| JP | 5786487 B2 | 9/2015 |
| TW | 201106424 A1 | 2/2011 |
| TW | 201642348 A | 12/2016 |

OTHER PUBLICATIONS

Taiwan Office Action issued to Application No. 108144625 dated Jan. 6, 2021.

PCT International Search Report and the Written Opinion of the International Searching Authority for International Application No. PCT/US2019/063082, dated Mar. 18, 2020.

Kubenz M et al: "Effective baking of thick and ultra-thick photo-resist layers by infrared radiation", Microelectronic Engineering, Elsevier Publishers BV., Amsterdam, NL, vol. 67-68, Jun. 1, 2003 (Jun. 1, 2003), pp. 495-501, XP004428910, ISSN: 0167-9317, DOI: 10.1016/S0167-9317(03)00106-0.

European Search Report issued to Patent Application No. 19899470.9 dated Aug. 4, 2022.

* cited by examiner

METHODS FOR CONTROLLING ETCH DEPTH BY LOCALIZED HEATING

CROSS-REFERENCE TO RELATED APPLICATIONS

This application claims priority to U.S. Provisional Patent Application No. 62/780,802, filed Dec. 17, 2018, which is hereby incorporated by reference in its entirety.

BACKGROUND

Field

Embodiments of the present disclosure generally relate to methods and systems for controlling etch depth by localized heating.

Description of the Related Art

Virtual reality is generally considered to be a computer generated simulated environment in which a user has an apparent physical presence. A virtual reality experience can be generated in 3D and viewed with a head-mounted display (HMD), such as glasses or other wearable display devices that have near-eye display panels as lenses to display a virtual reality environment that replaces an actual environment.

Augmented reality, however, enables an experience in which a user can still see through the display lenses of the glasses or other HMD device to view the surrounding environment, yet also see images of virtual objects that are generated for display and appear as part of the environment. Augmented reality can include any type of input, such as audio and haptic inputs, as well as virtual images, graphics, and video that enhances or augments the environment that the user experiences. As an emerging technology, there are many challenges and design constraints with augmented reality.

A virtual image is overlaid on an ambient environment to provide an augmented reality experience to the user. Waveguides are used to assist in overlaying images. Generated light is propagated through a waveguide until the light exits the waveguide and is overlayed on the ambient environment. Optical devices generally need multiple waveguides with different physical properties on the same substrate in order to guide light of different wavelengths.

One challenge of augmented reality is that manufacturing waveguides on substrates is a difficult process. It is often difficult to control the material properties, such as the temperature of the substrate, which affects the depth profiles of gratings disposed on the substrate. Uncontrolled temperature across the substrate leads to uncontrolled and inconsistent depth profiles of the gratings across the substrate.

Accordingly, there is a need for methods for controlling etch depth by providing localized heating across the substrate.

SUMMARY

In one embodiment, a method for controlling temperature across different regions of a substrate includes individually controlling a plurality of heating pixels disposed in a dielectric body of a substrate support assembly, the plurality of heating pixels providing temperature distributions on a first surface of the substrate disposed on a support surface of the dielectric body, the temperature distributions corresponding to a plurality of portions of at least one grating on a second surface of the substrate to be exposed to an ion beam; and exposing the substrate to the ion beam to form a plurality of fins on the at least one grating, the at least one grating having a distribution of depths corresponding to the temperature distributions, wherein: the temperature distributions include a first temperature at a first portion of the plurality of portions of the at least one grating and a second temperature at a second portion of the plurality of portions of the at least one grating; and the first temperature is different than the second temperature.

In another embodiment, a method for controlling temperature across different regions of a substrate includes individually controlling light emitting diodes (LEDs) of LED arrays to provide temperature distributions on a surface of the substrate, the temperature distributions corresponding to a plurality of portions of at least one grating on the surface of the substrate to be exposed to an ion beam; and exposing the substrate to the ion beam to form a plurality of fins on the at least one grating, the at least one grating having a distribution of depths corresponding to the temperature distributions, wherein: the temperature distributions include a first temperature at a first portion of the plurality of portions of the at least one grating and a second temperature at a second portion of the plurality of portions of the at least one grating; and the first temperature is different than the second temperature.

In another embodiment, a method for controlling temperature across different regions of a substrate includes individually controlling a plurality of heating pixels disposed in a dielectric body of a substrate support assembly, the plurality of heating pixels providing temperature distributions on a first surface of the substrate disposed on a support surface of the dielectric body, the temperature distributions corresponding to a plurality of portions of at least one grating on a second surface of the substrate to be exposed to an ion beam; individually controlling light emitting diodes (LEDs) of LED arrays to provide temperature distributions on the second surface of the substrate, the temperature distributions corresponding to a plurality of portions of at least one grating on the surface of the substrate to be exposed to an ion beam; and exposing the substrate to the ion beam to form a plurality of fins on the at least one grating, the at least one grating having a distribution of depths corresponding to the temperature distributions, wherein: the temperature distributions include a first temperature at a first portion of the plurality of portions of the at least one grating and a second temperature at a second portion of the plurality of portions of the at least one grating; and the first temperature is different than the second temperature.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

Embodiments of the present disclosure generally relate to methods for controlling etch depth by providing localized heating across a substrate. The method for controlling temperature across different regions of a substrate can include individually controlling a plurality of heating pixels disposed in a dielectric body of a substrate support assembly. The plurality of heating pixels provide temperature distributions on a first surface of the substrate disposed on a support surface of the dielectric body. The temperature distributions correspond to a plurality of portions of at least one grating on a second surface of the substrate to be exposed to an ion beam. Additionally, the temperatures can be controlled by individually controlling light emitting diodes (LEDs) of LED arrays. The substrate is exposed to the ion beam to form a plurality of fins on the at least one grating. The at least one grating has a distribution of depths corresponding to the temperature distributions.

Figure 1A:
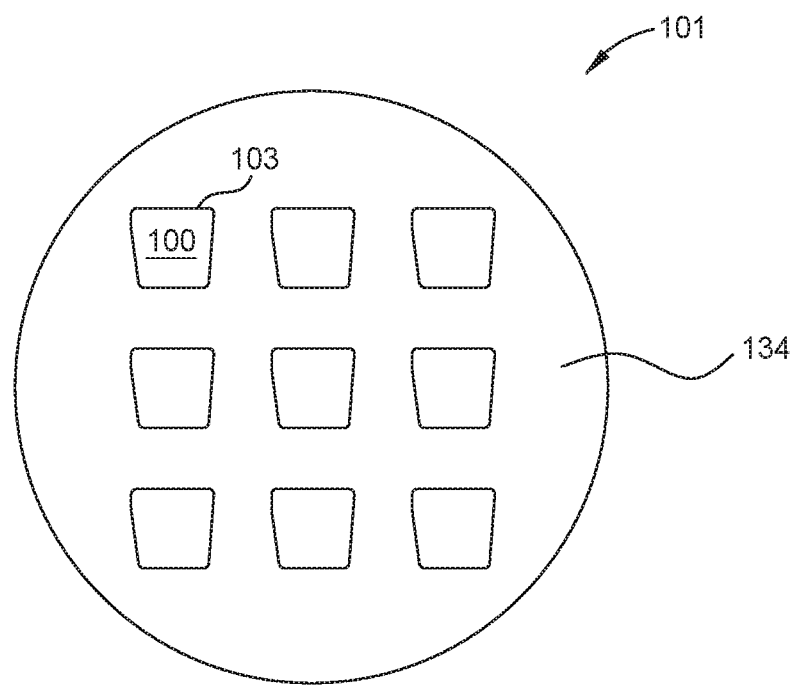
FIG. 1A is a perspective, frontal view of a substrate having a plurality of lenses disposed thereon according to at least one embodiment described herein.

FIG. 1A illustrates a perspective frontal view of a substrate 101, according to at least one embodiment. The substrate 101 is configured to be used in an optical device. The substrate 101 can be any substrate used in the art. For example, the substrate 101 includes a semiconducting material, e.g., silicon (Si), germanium (Ge), silicon germanium (SiGe), and/or a III-V semiconductor such as gallium arsenide (GaAs). In another example, the substrate 101 includes a transparent material, e.g., glass and/or plastic. The substrate 101 can have any number of insulating, semiconducting, or metallic layers thereon.

As shown, the substrate 101 includes a plurality of lenses 103 disposed on a surface 134. The plurality of lenses 103 are configured to focus light, depending on the use of the substrate 101. The plurality of lenses 103 are disposed on the substrate 101 in a grid of rows and columns. It is contemplated that other suitable arrangements of disposing the plurality of lenses 103 on the substrate 101 can be implemented according to the embodiments described herein. After methods of fabricating waveguide combiners described herein, each lens of the plurality of lenses 103 includes a waveguide combiner 100.

Figure 1B:
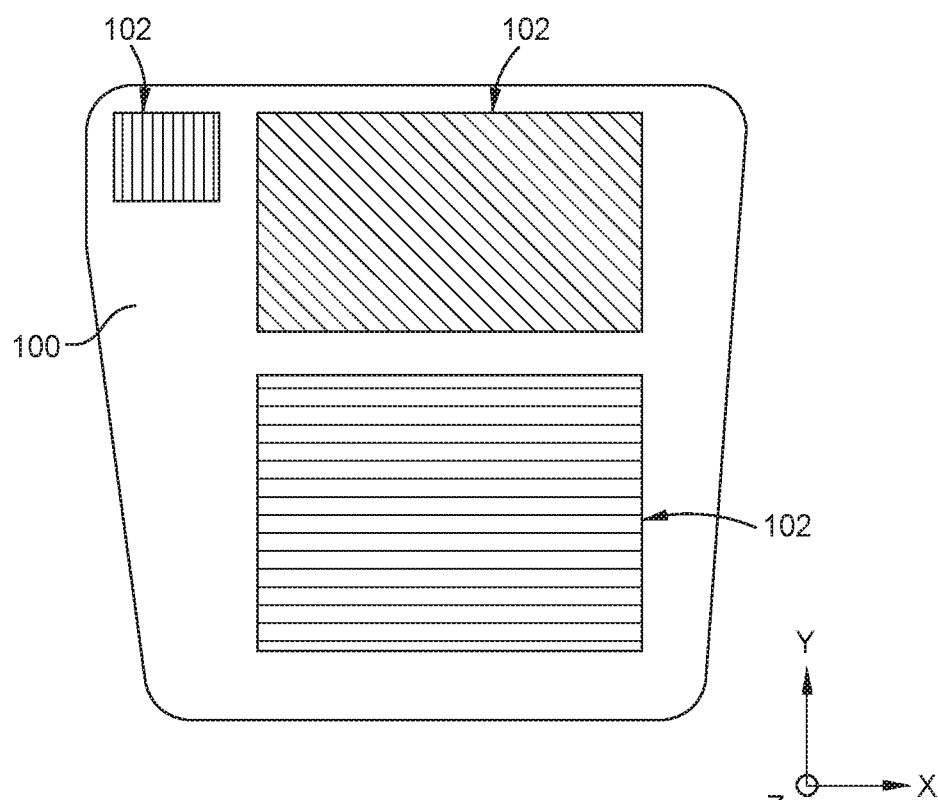
FIG. 1B is a perspective, frontal view of a waveguide combiner according to at least one embodiment described herein.

FIG. 1B illustrates a perspective frontal view of the waveguide combiner 100, according to one embodiment. The waveguide combiner 100 is configured to guide electromagnetic radiation (e.g., light). As shown, the waveguide combiner 100 includes a plurality of regions each including a plurality of gratings 102. The plurality of gratings 102 are configured to receive incident beams of light (a virtual image) having an intensity from a microdisplay. Each grating of the plurality of gratings 102 splits the incident beams into a plurality of modes, each beam having a mode. Zero-order mode ($T_0$) beams are refracted back or lost in the waveguide combiner 100. Positive first-order mode ($T_1$) beams undergo total internal-reflection (TIR) through the waveguide combiner 100 to the plurality of gratings 102. Negative first-order mode (T−1) beams propagate in the waveguide combiner 100 in a direction opposite to the $T_1$ beams. The $T_{-1}$ beams undergo TIR through the waveguide combiner 100.

Figure 2A:
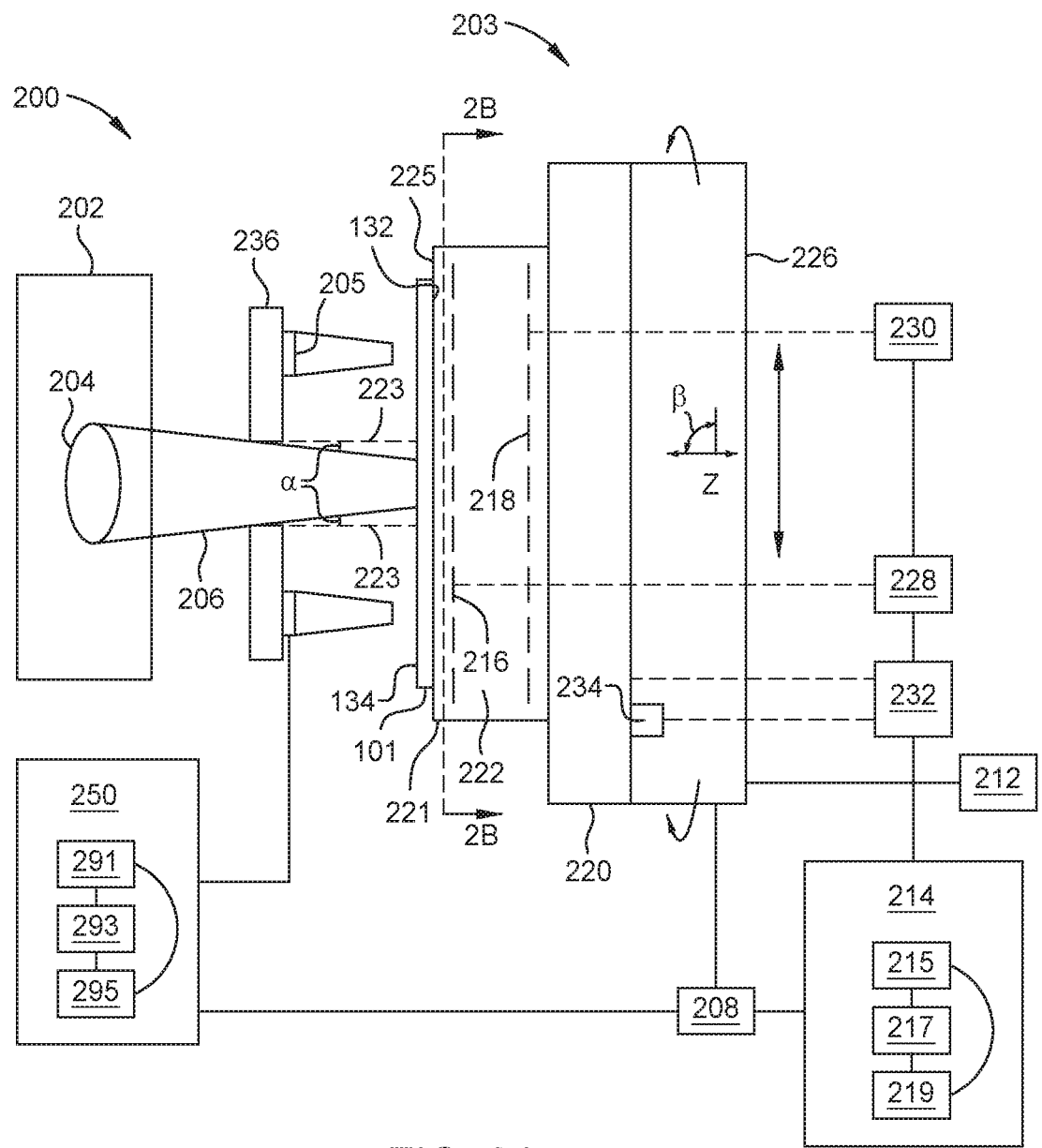
FIG. 2A is a schematic, cross-sectional view of a system including a substrate support assembly and an extraction electrode having light emitting diode (LED) arrays according to at least one embodiment described herein.

FIG. 2A is a schematic, cross-sectional view of a system 200 according to at least one embodiment herein. The system 200 includes an ion beam chamber 202 that houses an ion beam source 204 and a substrate support assembly 203 that supports the substrate 101. The substrate support assembly 203 is a pixelated substrate support assembly. The substrate support assembly 203 generally includes a cooling base 220 and a substrate support member, for example an electrostatic chuck 221. The substrate support assembly 203 may be removably coupled to a support member 226. The substrate support assembly 203 may be periodically removed from the support member 226 to allow for refurbishment of the substrate support assembly 203. The electrostatic chuck 221 generally includes a chucking electrode 218 embedded in a dielectric body 222. The chucking electrode 218 may be configured as a mono polar or dipolar electrode, or other suitable arrangement. The chucking electrode 218 is coupled to a chucking power source 230 which provides a RF or DC power to electrostatically secure the substrate 101 to the upper surface of the dielectric body 222. The dielectric body 222 may be fabricated from a ceramic material, such as AlN, or a polymer, such as polyimide, polyetheretherketone, polyaryletherketone and the like.

Figure 4:
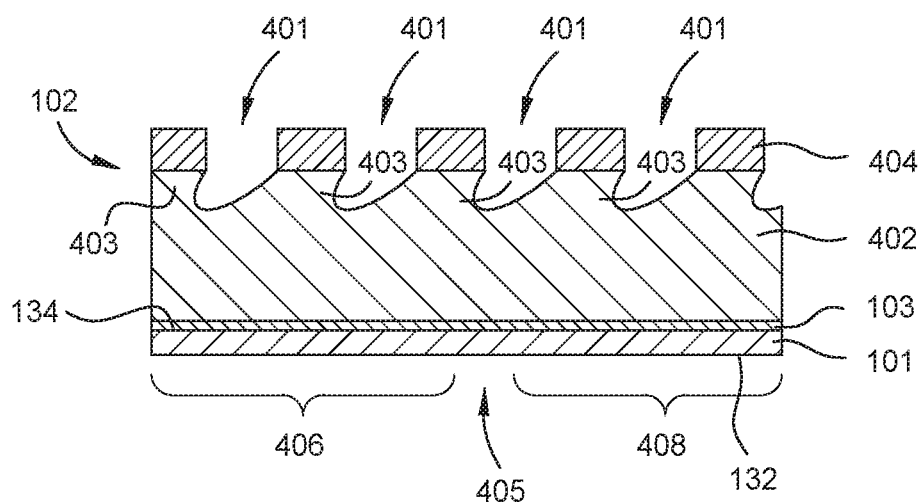
FIG. 4 is a schematic cross-sectional view of the substrate and the grating according to at least one embodiment described herein.

The ion beam source 204 is configured to generate an ion beam 206, such as a ribbon beam or a spot beam. The ion beam chamber 202 is configured to direct the ion beam 206 at an optimized angle, α, relative to a surface normal 223 of the substrate 101. The substrate support assembly 203 includes the electrostatic chuck 221, which is coupled to the cooling base 220. The cooling base 220 is coupled to the support member 226. In some embodiments, an actuator 208 is configured to tilt the support member 226, such that the substrate 101 is positioned at a tilt angle, β, relative to the z-axis of the ion beam chamber 202. In another embodiment, which can be combined with other embodiments described herein, the actuator 208, in operation, rotates the substrate 101 about the x-axis of the support member 226. To form gratings relative to the surface normal 223, the ion beam source 204 generates the ion beam 206 and the ion beam chamber 202 directs the ion beam 206 towards the substrate 101 at the optimized angle α. The actuator 208 positions the support member 226 so that the ion beam 206 contacts grating material 402 (FIG. 4) at the ion beam angle on desired portions of the grating material 402, forming a plurality of fins 403 at a plurality of depths 401 (FIG. 4).

Figure 2B:
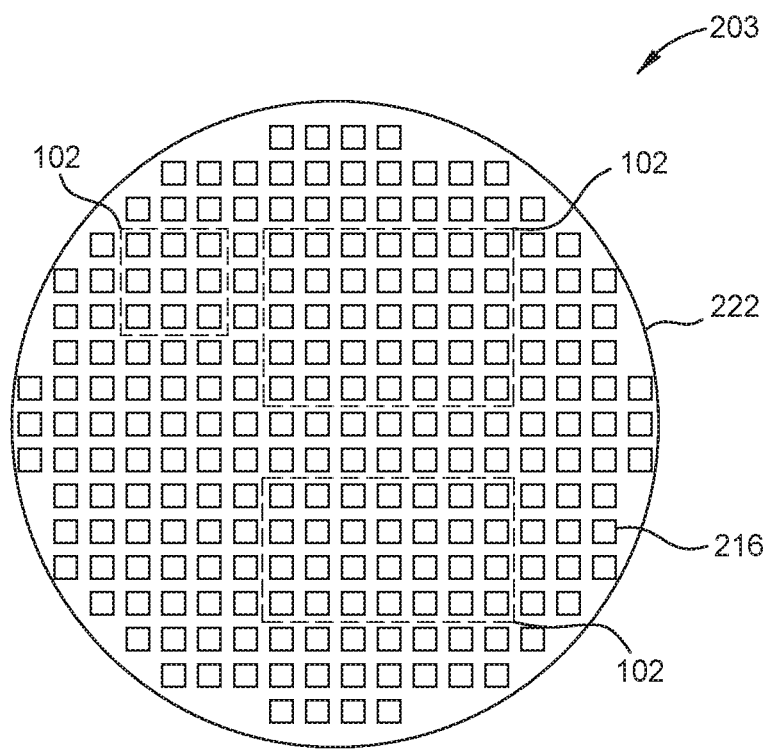
FIG. 2B is a perspective, frontal view a substrate support assembly of a system according to at least one embodiment described herein.
Figure 2C:
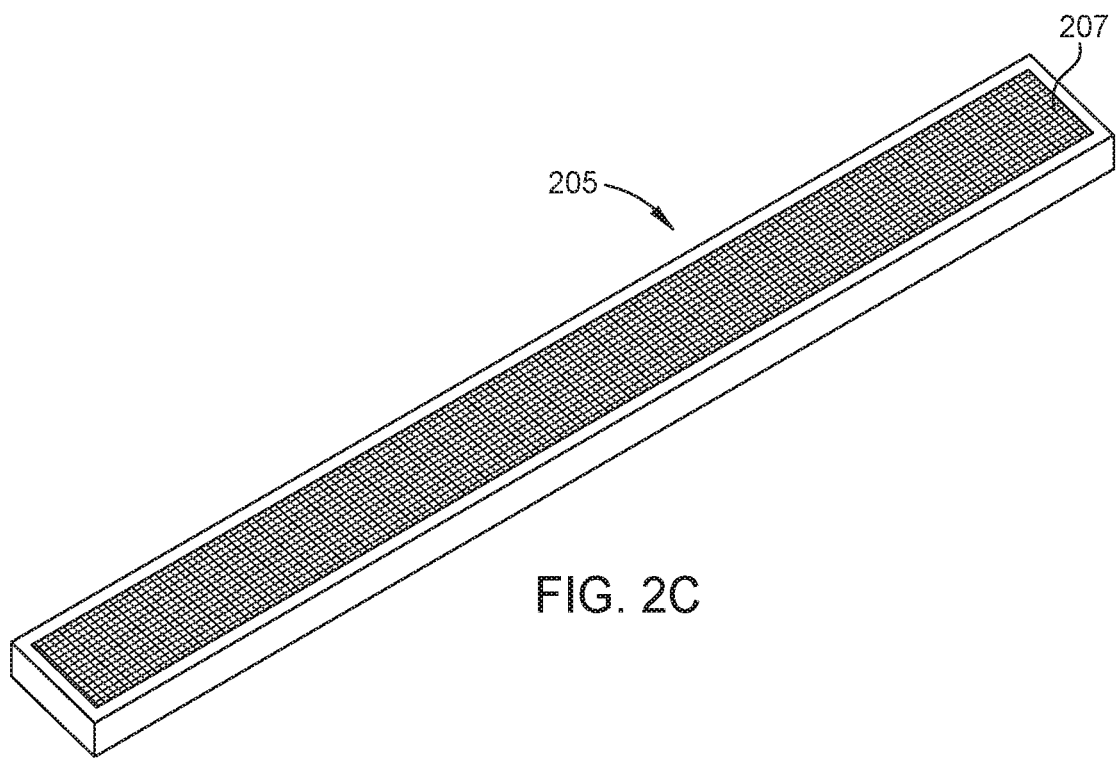
FIG. 2C is a schematic view of an LED array of a system according to at least one embodiment described herein.

The system 200 also includes an extraction electrode 236 having light emitting diode (LED) arrays 205. As shown in FIG. 2C, a schematic view of an LED array of the system 200, the LED arrays 205 are comprised of a plurality of individual LEDs 207, arranged in an array of rows and columns. Any number of rows and columns of LEDs 207 may be used. A controller 250 is operable to individually control each of the LEDs 207 of the LED arrays 205, such that temperature distributions may be provided on the surface 134 of the substrate 101 facing the ion beam 206 to correspond to at least one of the plurality of gratings 102.

The substrate support assembly 203 includes a controller 214 operable to be in communication with a power source 212, the actuator 208, and a controller 250 of the LED arrays 205. The controller 214 and the controller 250 are operable to control aspects of the substrate support assembly 203 during processing. The electrostatic chuck 221 includes a plurality of heating pixels 216, shown in FIGS. 2A and 2B, disposed in the dielectric body 222 and coupled to a power source 228. The controller 214 is operable to individually control the each of the heating pixels 216, such that temperature distributions may be provided on the surface 132 of the substrate 101 retained on a support surface 225 of the dielectric body 222, to correspond to at least one of the plurality of gratings 102. In one embodiment, the heating pixels 216 include a plurality of laterally separated heating zones, wherein the controller 214 enables one zone of the heating pixels 216 to be preferentially heated relative to one or more other zones. The electrostatic chuck 221 may also include one or more thermocouples (not shown) for providing temperature feedback information to the controller 214 for controlling the power applied by the power source 228 to the heating pixels 216, and for operating the cooling base 220, as further described below.

The temperature controlled cooling base 220 is coupled to a heat transfer fluid source 232. The heat transfer fluid source 232 provides a heat transfer fluid, such as a liquid, gas or combination thereof, which is independently circulated near a plurality of the heating pixels 216, thereby enabling local control of the heat transfer between the electrostatic chuck 221 and cooling base 220, and ultimately, control of the lateral temperature profile of the substrate 101. A fluid distributor 234 is fluidly coupled between an outlet of the heat transfer fluid source 232 and the temperature controlled cooling base 220. The fluid distributor 234 operates to control the amount of heat transfer fluid provided to heating pixels 216.

As shown, the controller 214 includes a central processing unit (CPU) 215, memory 217, and support circuits (or I/O) 219. The CPU 215 is one of any form of computer processors that are used in industrial settings for controlling various processes and hardware (e.g., pattern generators, motors, and other hardware) and monitor the processes (e.g., processing time and substrate position or location). The memory 217 is connected to the CPU 215, and is one or more of a readily available memory, such as random access memory (RAM), read only memory (ROM), floppy disk, hard disk, or any other form of digital storage, local or remote. Software instructions and data can be coded and stored within the memory 217 for instructing the CPU 215. The support circuits 219 are also connected to the CPU 215 for supporting the CPU in a conventional manner. The support circuits 219 include conventional cache, power supplies, clock circuits, input/output circuitry, subsystems, and the like.

As shown, the controller 250 includes a central processing unit (CPU) 291, memory 293, and support circuits (or I/O) 295. The CPU 291 is one of any form of computer processors that are used in industrial settings for controlling various processes and hardware (e.g., pattern generators, motors, and other hardware) and monitor the processes (e.g., processing time and substrate position or location). The memory 293 is connected to the CPU 291, and is one or more of a readily available memory, such as random access memory (RAM), read only memory (ROM), floppy disk, hard disk, or any other form of digital storage, local or remote. Software instructions and data can be coded and stored within the memory 293 for instructing the CPU 291. The support circuits 295 are also connected to the CPU 291 for supporting the CPU in a conventional manner. The support circuits 295 include conventional cache, power supplies, clock circuits, input/output circuitry, subsystems, and the like.

Figure 3:
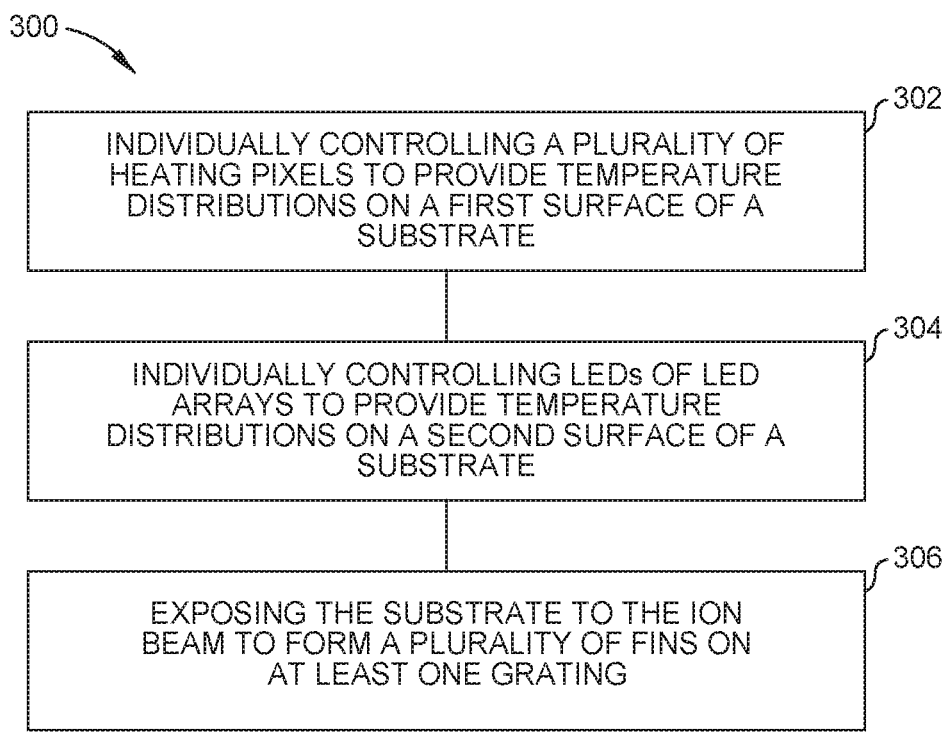
FIG. 3 is a flow diagram of a method of controlling the temperature of different regions of the substrate according to at least one embodiment described herein.

FIG. 3 is a flow diagram of a method 300 for controlling the temperature of different regions of the substrate 101. In these embodiments, the method 300 is performed with the systems and devices described in FIGS. 1-2C, but is not limited to these systems and devices and can be performed with other similar systems and devices.

In block 302, the plurality of heating pixels 216 disposed in the dielectric body 222 of the substrate support assembly 203 are individually controlled. The plurality of heating pixels 216 providing temperature distributions on a surface 132 of the substrate 101 disposed on the support surface 225 of the dielectric body 222. The temperature distributions correspond to a plurality of portions 406, 408 of the grating 102 on a surface 134 of the substrate 101 to be exposed to an ion beam 206 (FIG. 4).

In block 304, which can be performed independently or in addition to block 302, the LEDs 207 of LED arrays 205 are individually controlled to provide temperature distributions on the surface 134 of the substrate 101. The temperature distributions correspond to a plurality of portions 406, 408 of the grating 102 on the surface 134 of the substrate 101 to be exposed to an ion beam 206 (FIG. 4).

In block 306, the substrate 101 is exposed to the ion beam 206 to form a plurality of fins 403 on the grating 102, the grating 102 having a plurality of depths 401 corresponding to the temperature distributions (FIG. 4). The temperature distributions include a first temperature at a first portion 406 of the plurality of portions 405 of the grating 102 and a second temperature at a second portion 408 of a plurality of portions 405 of the grating 102. In these embodiments, the first temperature is different than the second temperature.

FIG. 4 is a schematic cross-sectional view of the substrate 101 and the grating 102 before, during, and after the method 300 according to at least one embodiment described herein. In the embodiments described herein, when the ion beam 206 is directed toward the substrate 101, the ion beam 206 forms the plurality of fins 403 corresponding to the plurality of the depths 401 in the grating material 402 disposed on the lens 103. Although FIG. 4 shows the ion beam 206 forming the plurality of fins 403 in the grating material 402, in other embodiments, the plurality of fins 403 can be formed directly on the surface 134 of the substrate 101. The grating material 402 is exposed by the patterned hardmask 404. The plurality of depths 401 of each of the plurality of fins 403 can vary based on the temperature of the substrate 101. As discussed above, the temperature of the substrate 101 can be controlled by the plurality of heating pixels 216 and/or by the LED arrays 205. As shown in FIG. 4, the grating 102 can be divided into the plurality of portions 405. The temperature can be controlled in each of the plurality of portions 405 to control the plurality of depths 401. For example, a first temperature can be applied to the first portion 406 of the plurality of portions 405 of the grating 102 and a second temperature can be applied to the second portion 408 of the plurality of portions 405 of the grating 102. Although two portions are shown in FIG. 4, any number of plurality of portions 405 can be used, and any number of different temperatures can be applied to each of the plurality of portions 405.

In some embodiments, the grating material 402 includes silicon oxycarbide (SiOC), titanium dioxide ($TiO_2$), silicon dioxide ($SiO_2$), vanadium (IV) oxide ($VO_x$), aluminum oxide ($Al_2O_3$), indium tin oxide (ITO), zinc oxide (ZnO), tantalum pentoxide ($Ta_2O_5$), silicon nitride ($Si_3N_4$), titanium nitride (TiN), and/or zirconium dioxide ($ZrO_2$) containing materials. The grating material 402 can have a refractive index between about 1.5 and about 2.65. In some embodiments, the patterned hardmask 404 is a non-transparent hardmask that is removed after the waveguide combiner is formed. For example, the non-transparent hardmask includes reflective materials, such as chromium (Cr) or silver (Ag). In another embodiment, the patterned hardmask 404 is a transparent hardmask.

While the foregoing is directed to implementations of the present invention, other and further implementations of the invention may be devised without departing from the basic scope thereof, and the scope thereof is determined by the claims that follow.

We claim:

1. A method for controlling temperature across different regions of a substrate, comprising:
    individually controlling a plurality of heating pixels disposed in a dielectric body of a substrate support assembly, the plurality of heating pixels providing temperature distributions on a first surface of the substrate disposed on a support surface of the dielectric body, the temperature distributions corresponding to a plurality of portions of at least one grating on a second surface of the substrate to be exposed to an ion beam; and
    exposing the substrate to the ion beam to form a plurality of fins on the at least one grating, the at least one grating having a distribution of depths corresponding to the temperature distributions, wherein:
    the temperature distributions include a first temperature at a first portion of the plurality of portions of the at least one grating and a second temperature at a second portion of the plurality of portions of the at least one grating; and
    the first temperature is different than the second temperature.

2. The method of claim 1, wherein at least one lens is disposed on the substrate.

3. The method of claim 2, wherein the at least one grating comprises a grating material.

4. The method of claim 3, wherein the grating material is exposed by a patterned hardmask.

5. The method of claim 1, further comprising tilting the substrate by an actuator.

6. The method of claim 1, further comprising rotating the substrate by an actuator.

7. The method of claim 1, wherein the ion beam is configured to be directed to the substrate at an angle relative to a surface normal of the substrate.

8. A method for controlling temperature across different regions of a substrate, comprising:
    individually controlling a plurality of heating pixels disposed in a dielectric body of a substrate support assembly, the plurality of heating pixels providing first temperature distributions on a first surface of the substrate disposed on a support surface of the dielectric body, the first temperature distributions from the plurality of heating pixels corresponding to a plurality of portions of at least one grating on a second surface of the substrate to be exposed to an ion beam;
    individually controlling light emitting diodes (LEDs) of LED arrays to provide second temperature distributions on the second surface of the substrate, the second temperature distributions from the LED arrays corresponding to a plurality of portions of at least one grating on the second surface of the substrate to be exposed to an ion beam; and
    exposing the substrate to the ion beam to form a plurality of fins on the at least one grating, the at least one grating having a distribution of depths corresponding to the first temperature distributions and the second temperature distributions, wherein:
    the first temperature distributions and the second temperature distributions include a first temperature at a first portion of the plurality of portions of the at least one grating and a second temperature at a second portion of the plurality of portions of the at least one grating; and
    the first temperature is different than the second temperature.

9. The method of claim 8, wherein at least one lens is disposed on the substrate.

10. The method of claim 9, wherein the at least one grating comprises a grating material.

11. The method of claim 10, wherein the grating material is exposed by a patterned hardmask.

12. The method of claim 8, further comprising tilting the substrate by an actuator.

13. The method of claim 8, further comprising rotating the substrate by an actuator.

14. The method of claim 8, wherein the ion beam is configured to be directed to the substrate at an angle relative to a surface normal of the substrate.

* * * * *